United States Patent [19]

Matsuo et al.

[11] Patent Number: 5,645,969

[45] Date of Patent: Jul. 8, 1997

[54] PHOTOSENSITIVE COMPOSITION AND PHOTOSENSITIVE LITHOGRAPHIC PRINTING PLATE

[75] Inventors: Fumiyuki Matsuo; Daisuke Kanazawa; Mitsuru Sasaki, all of Yokohama; Shinichi Matsubara; Katsuhiko Higashino, both of Hino; Toshiaki Yokoo, Yokohama, all of Japan

[73] Assignees: Mitsubishi Chemical Corporation; Konica Corporation, both of Tokyo, Japan

[21] Appl. No.: 576,136

[22] Filed: Dec. 21, 1995

[30] Foreign Application Priority Data

Dec. 27, 1994 [JP] Japan .................................. 6-337070
Jan. 6, 1995 [JP] Japan .................................. 7-000692

[51] Int. Cl.$^6$ ...................................... G03F 7/023
[52] U.S. Cl. ........................ 430/165; 430/190; 430/191; 430/192; 430/193; 528/137; 528/139
[58] Field of Search .................... 430/190, 165, 430/192, 193, 191; 528/137, 139

[56] References Cited

U.S. PATENT DOCUMENTS

| | | | |
|---|---|---|---|
| 4,235,989 | 11/1980 | Leong et al. | 528/139 |
| 4,812,551 | 3/1989 | Oi et al. | 430/192 |
| 4,840,869 | 6/1989 | Kita et al. | 430/191 |
| 4,863,829 | 9/1989 | Furuta et al. | 430/192 |
| 5,338,643 | 8/1994 | Kanazawa et al. | 430/190 |
| 5,413,894 | 5/1995 | Sizensky et al. | 430/192 |

FOREIGN PATENT DOCUMENTS

| | | |
|---|---|---|
| 0118291 | 9/1984 | European Pat. Off. . |
| 0445680 | 9/1991 | European Pat. Off. . |
| 0623633 | 11/1994 | European Pat. Off. . |
| 59-162542 | 9/1984 | Japan . |
| 60-159846 | 8/1985 | Japan . |
| 3-253859 | 11/1991 | Japan . |
| 3-253860 | 11/1991 | Japan . |

OTHER PUBLICATIONS

Database WPI, Derwent Publications, AN–91–374687, and Japan Abstracts, vol. 16, No. 56 (P–1310), Feb. 12, 1992, JP–A–374687, Nov. 12, 1991.

Database WPI, Derwent Publications, AN–92–145027, JP–A–4–069661, Mar. 4, 1992.

Advanced Materials for Optics and Electronics, vol. 4, No. 2, pp. 75–82, Mar./Apr. 1994, Makota Hanabata, "Novolac–Based Resists".

Journal of Vacuum Science & Technology A, vol.9, No. 2, pp. 254–260, Mar./Apr. 1991 Makota Hanabata, et al., "A Selection Principle of Phenolic Compounds for Novolak Resins in High Performance Positive Photoresists".

Polymers for Advanced Technologies, vol. 5, No. 1, pp. 2–11, Jan. 1994, Toru Kajita, et al., "Resist Performances and Structure of Phenolic Resins Using Multi–Substituted Phenols".

*Primary Examiner*—John S. Chu
*Attorney, Agent, or Firm*—Oblon, Spivak, McClelland, Maier & Neustadt, P.C.

[57] ABSTRACT

A photosensitive composition comprising a quinonediazide compound and a binder resin, wherein said resin is a resin obtained by condensing a phenol component comprising the following (1) to (3), and an aldehyde or a ketone, and $X \geq 0.57$, where $X = A/B$, where A is an integrated value of peaks from 23.0 to 31.0 ppm, and B is an integrated value of peaks from 23.0 to 37.0 ppm, in the $^{13}$C-NMR spectrum of a dimethyl sulfoxide deuteride solution of this resin:

Phenol Component (1) a phenol: from 50 to 100 mol %
(2) a m-alkylphenol: from 0 to 50 mol %
(3) a p-alkylphenol: from 0 to 50 mol %

14 Claims, No Drawings

PHOTOSENSITIVE COMPOSITION AND PHOTOSENSITIVE LITHOGRAPHIC PRINTING PLATE

The present invention relates to a photosensitive composition suitable for a photosensitive lithographic printing plate or for a photoresist. Particularly, it relates to a photosensitive composition suitable for photosensitive lithographic printing plate which is not only excellent in chemical resistance, high sensitivity and developability but also excellent in the color change after exposure, ball point pen aptitude and gradation.

A positive photosensitive lithographic printing plate has low resistance against various treating reagents used for printing, such as solvents contained in e.g. plate cleaners, and consequently, it has a drawback that its printing resistance is low. Developing treatment of a positive photosensitive lithographic printing plate is usually conducted in a developer made of an aqueous alkaline solution, and the developing ability of the developer is susceptible to a change under various conditions. For example, there may be a case where the developing ability decreases due to fatigue by mass treatment or due to deterioration by oxidation in air, whereby even treated, the photosensitive layer at the non-developed portion of the printing plate will not completely be dissolved. It is desired that even with a developer having such treating ability decreased, the photosensitive layer has a wide allowance for development showing the same developability as in the case where it is treated with a standard developer (the allowable range of decrease in the developing ability in which a proper development result is obtainable, will be hereinafter referred to as "under developability").

As an attempt to improve the resistance against treating reagents used for printing, it is known to add a vinyl polymer or an acrylic polymer having phenolic hydroxyl groups and having a Tg of from 100° to 300° C. (Japanese Unexamined Patent Publications No. 291245/1989 and No. 291244/1989). However, such a vinyl polymer or an acrylic polymer having phenolic hydroxyl groups and having a Tg of from 100° to 300° C., has a drawback that the sensitivity is low, and the developability (allowance for development) is low.

Further, when a photosensitive lithographic printing plate is used for exposure through an original film, if a foreign matter such as dust is attached on the original film or the photosensitive lithographic printing plate, a very small quantity of light is likely to enter from the attached portion, whereby it tends to be difficult to form a sharp resist image (printing fade phenomenon). Further, when a conventional lithographic printing plate is subjected to an operation such as exposure or development for a long time (about 10 minutes) under white light (fluorescent lamp), there has been a problem that a film reduction of the photosensitive layer of the printing plate is likely to result by sensitization, whereby even a non-exposed portion will be developed (safe light property). Accordingly, it has been attempted to develop a lithographic printing plate excellent in the contrasty property so that a sharp resist image can be obtained even when a foreign matter such as dust is attached on the original film or on the photosensitive lithographic printing plate.

Heretofore, as one of techniques for imparting a contrasty property, there has been a method of incorporating to a photosensitive composition a surfactant such as polyoxyethylenelauryl ether, polyoxyethylenecetyl ether, polyoxyethylenestearyl ether, polyoxyethyleneoleyl ether or polyoxyethylene higher alcohol ether, or a method of employing o-naphthoquinonediazide-4-sulfonic acid as a compound containing an o-quinonediazide group. However, even if such a contrasty photosensitive layer is coated on a conventional gained support, there has been a problem in developability such that after exposure and development, a film of the exposed layer tends to remain on the support.

Accordingly, it has been desired to develop a photosensitive lithographic printing plate whereby the operation efficiency with respect to the above-mentioned printing fade phenomenon and safe light property can be improved and at the same time the developability will not be impaired.

On the other hand, various proposals have been made to improve the sensitivity of a photosensitive lithographic printing plate containing an o-naphthoquinonediazide sulfonic acid ester. For example, it has been attempted to incorporate a cyclic acid anhydride (Japanese Unexamined Patent Publication No. 80022/1977) or an organic strong acid (Japanese Unexamined Patent Publication No. 88942/1985). However, such an attempt brings about a drawback that developability tends to be poor, although the sensitivity may be improved. Further, as an attempt to increase the sensitivity without impairing the developability, it is known to incorporate bisphenol A (Japanese Unexamined Patent Publication No. 150047/1985), but the effects are not yet satisfactory.

On the other hand, there has been a problem that at the time of printing a lithographic printing plate, if the position of a film original is marked by an oil base ball point pen on a photosensitive layer for alignment with the original film, this marking will appear on an image after development, probably due to erosion of the photosensitive layer by a solvent of the ink of the ball point pen. Accordingly, a photosensitive composition for a photosensitive layer which is scarcely eroded by the solvent of ink of a ball point pen (hereinafter referred to as "ball point pen aptitude" or "BP aptitude") has been desired.

As a binder resin to be used for a photosensitive composition, a novolak resin is known. Various attempts for improving the novolak resin have been made. Among them, a resin so-called high orthonovolak resin is known which contains a large amount of an ortho-ortho bond as compared with a novolak resin prepared by a polycondensation reaction by means of an acid catalyst. This resin is used in the field of photoresist in an attempt to increase the γ-value (Japanese Examined Patent Publication No. 2181/1992), and an ionization sensitive radioactive resin composition having a high sensitivity and a wide defocus latitude, whereby scum is scarcely formed (Japanese Unexamined Patent Publication No. 253859/1991) or a positive photoresist composition whereby defects in pattern due to fine foams during exposure scarcely form, or fine defects due to scum scarcely form (Japanese Unexamined Patent Publication No. 253860/1991) have been proposed. However, these patent specifications disclose nothing about the chemical resistance, the developability and the resistance against ball point pen writing, which are critical for a photosensitive lithographic printing plate.

More specifically, Japanese Unexamined Patent Publication No. 253860/1991 discloses a positive photoresist composition comprising an alkali-soluble substituted phenol novolak resin and a 1,2-quinonediazide compound, wherein said novolak resin is a condensation product of a mixture of m-cresol and p-cresol, with formaldehyde, and the relation between the m-cresol content in the novolak and $X=A/(A+B+C)$, satisfies a specific relation, where A is integrated value of peaks from 23.0 to 31.0 ppm, B is an integrated value of peaks of from 31.0 to 34.0 ppm and C is an integrated value of peaks of from 34.0 to 37.0 ppm, in the $^{13}$C-NMR spectrum of a dimethylsulfoxide deuteride solution of this resin. This publication discloses that the positive photoresist composition has a high resolution and fine defects due to scum scarcely form during its development. However, it discloses nothing about the performance if such a composition is employed as a photosensitive composition for lithographic printing plates, or it does not disclose a novolak resin which contains a phenol. According to the study by the present inventors, a conventional composition suitable for a photoresist containing a high orthonovolak resin can not satisfy the properties required for a photosensitive lithographic printing plate, and it is unsatisfactory particularly with respect to the sensitivity and developability.

It is an object of the present invention to provide a photosensitive composition excellent in the resistance against treating reagents used for printing.

Another object of the present invention is to provide a photosensitive composition suitable for a photosensitive lithographic printing plate having a high sensitivity and being excellent in the developability such as under developability and over developability.

Still another object of the present invention is to provide a photosensitive composition suitable for a photosensitive lithographic printing plate excellent in the ball point pen aptitude and the contrasty property.

A further object of the present invention is to provide an excellent photosensitivity lithographic printing plate having a high resolution and having well balanced treating agent resistance, developability, ball point pen aptitude and contrasty property as mentioned above.

The present inventors have conducted extensive studies to improve the novolak resin as the binder resin taking into various properties required for the photosensitive lithographic printing plate into consideration and as a result, have found that a composition having a quinonediazide compound combined with a novolak resin obtained by co-condensation of specific phenols with an aldehyde or ketone, of which a microstructure satisfies a certain specific requirement, is extremely suitable for a lithographic printing plate.

The present invention has been accomplished on the basis of this discovery.

That is, the present invention provides a photosensitive composition comprising a quinonediazide compound and a binder resin, wherein said resin is a resin obtained by condensing a phenol component comprising the following (1) to (3), and an aldehyde or a ketone, and $X \geq 0.57$, where $X=A/B$, where A is an integrated value of peaks from 23.0 to 31.0 ppm, and B is an integrated value of peaks from 23.0 to 37.0 ppm, in the $^{13}$C-NMR spectrum of a dimethyl sulfoxide deuteride solution of this resin:

Phenol Component
(1) a phenol: from 50 to 100 mol %
(2) a m-alkylphenol: from 0 to 50 mol %
(3) a p-alkylphenol: from 0 to 50 mol %

The present invention also provides a photosensitive lithographic printing plate comprising a support and a photosensitive layer formed thereon, wherein the photosensitive layer is made of the above photosensitive composition.

Now, the present invention will be described in detail with reference to the preferred embodiments.

In the present invention, it is essential to use a binder resin which is a novolak resin produced by co-condensing a phenol component having a specific composition with an aldehyde or a ketone, and which has a predetermined X value as defined above. If any one of these requirements is not met, the effect of the present invention can not be obtained. To produce such a resin, the phenol component comprises (1) from 50 to 100 mol %, preferably from 50 to 95 mol %, of a phenol, (2) from 0 to 50 mol % of a m-alkylphenol and (3) from 0 to 50 mol % of a p-alkylphenol. Preferably, it consists of the phenol (1) and at least one of the m-alkylphenol (2) and the p-alkylphenol (3). If the phenol is less than 50 mol %, the solubility in the developer tends to be poor, and the under developability tends to deteriorate, such being undesirable.

The alkyl group in the m- or p-alkylphenol is preferably a $C_{1-4}$ lower alkyl group, such as a methyl, ethyl, propyl or i-propyl group. More preferably, the binder resin is a resin produced by using a phenol component which contains at least 25 mol % of the m-alkylphenol (2) and/or the p-alkylphenol (3) in the phenol component. Particularly preferably, it is a resin produced by using a phenol component comprising (1) from 50 to 75 mol % of a phenol, (2) from 0 to 50 mol % of a m-alkylphenol and (3) from 0 to 30 mol % of p-alkylphenol. Further, the phenol component more preferably comprises (1) from 55 to 75 mol % of a phenol, (2) from 10 to 45 mol % of a m-alkylphenol and (3) from 0 to 30 mol % of a p-alkylphenol.

With respect to specific examples of such a phenol component, the phenol (1) may be, in addition to phenol, a monovalent, bivalent or trivalent phenol, such as catechol, resorcinol, hydroquinone or pyrogallol. However, a monovalent phenol is preferred. The m-alkylphenol (2) may have a substituent at a position other than the m-position, so long as it has an alkyl group at the m-position, and it may, for example, be m-cresol, 3,5-xylenol, carbachol or thymol. The p-alkylphenol (3) may have a further substituent at a position other than the p-position, so long as it has an alkyl group at the p-position, and it may, for example, be p-cresol or a 2,4-xylenol. These materials may be used alone or in combination as a mixture. However, preferred as the phenol is the one having at least 95 mol % of a monovalent phenol, and preferred as the m-alkylphenol is the one containing 95 mol % of m-cresol. Likewise, preferred as the p-alkylphenol is the one containing at least 95 mol % of p-cresol.

The aldehyde may, for example, be formaldehyde, acetoaldehyde, benzaldehyde, acrolein, methacrolein, crotonaldehyde, acrolein dimethylacetal or furfural. Preferred is formaldehyde or benzaldehyde. As the formaldehyde, an aqueous formaldehyde solution (formalin), or paraformaldehyde as an oligomer of formaldehyde, may be employed. It is particularly preferred to employ 37% formalin, since it is produced in a large amount on an industrial scale.

The ketone may, for example, be acetone or methyl ethyl ketone.

For the production of the binder resin of the present invention, a conventional method used for a reaction of this type, particularly a method for producing a high orthonovolak resin, may suitably be employed. For example, there may be mentioned a method wherein phenols comprising m- and p-mixed cresols are subjected to addition condensation with an aldehyde under a condition of pH 4 to 7 using an organic acid salt of a certain specific bivalent metal shown in Japanese Examined Patent Publication No. 2181/1992, as a catalyst, or a method wherein a phenol and an aldehyde are partially addition-condensed using an organic salt of a bivalent metal as a catalyst followed by further addition condensation employing an acid as a catalyst. Further, as disclosed in J. Appl. Chem. 1957, p.676–688, there may be a method wherein phenols are subjected to addition condensation with an aldehyde by means of a bivalent metal hydroxide or oxide as a catalyst, or a method wherein phenols are subjected to partial addition condensation with an aldehyde by means of a bivalent metal hydroxide or oxide as a catalyst, followed by further addition condensation by means of an acid as a catalyst.

Furthermore, there may be mentioned a method wherein a aqueous formalin solution is added to phenols prepared by mixing m- and p-cresols in a predetermined ratio, followed by condensation by means of triethylamine (Japanese Unexamined Patent Publications No. 253859/1991 and No. 253860/1991), or a method wherein phenols and paraformaldehyde were dissolved in a non-polar solvent such as toluene and heated to a high temperature under pressure. An acid catalyst such as oxalic acid is widely used for the production of novolak resins. However, a resin produced by the method for producing a high orthonovolak resin tends to have a higher value for the above-mentioned value X than a resin obtained by a method for producing a usual novolak resin. In the present invention, it is preferred to employ an organic acid salt or oxide of a bivalent metal, as the catalyst.

The bivalent metal may, for example, be barium, strontium, calcium, magnesium, manganese, zinc, cadmium, cobalt or lead. Among them, it is preferred to employ zinc.

For the binder resin of the present invention, it is essential that $X \geq 0.57$, where $X=A/B$, where A is an integrated value of peaks from 23.0 to 31.0 ppm, and B is an integrated value of peaks from 23.0 to 37.0 ppm, in the $^{13}C$-NMR spectrum of a dimethylsulfoxide deuteride solution of this resin.

Here, measurement of $^{13}C$-NMR is carried out under the following conditions. Using EX-270 model Fourier transform NMR apparatus (resonance frequency: 67.00 MHz), a reverse gated decoupling method (non NOE decoupling measurement) is applied. The measuring temperature: 22°–24° C. pulse width: 6.8 µs (about 45°), waiting time: 3 seconds, observed frequency width: 20,000 Hz, data point number: 33 K, number of integration: at least 4,000 times, and the standard: tetramethylsilane being 0.0 ppm.

Each of peaks in the $^{13}C$-NMR spectrum defined here is attributable to the methylene bond connecting aromatic rings, and the above peak ratio e.g. value X is interpreted to correspond to the specific mode of connection between the two different or same rings including their configurations.

However, in reality, in a novolak resin made of a mixture of phenols and alkylphenols, the spectrum of these portions is wide and consists of a mixture of many peaks. Although attribution of individual peaks has not yet been identified and various modes of connection may be contained as the modes of connection contained in the above value X, it is believed that in general, the value X is interrelated to the proportions of those modes in which the phenols and the alkylphenols are connected to each other at the respective orthopositions.

In the binder resin of the present invention, the above value X is $X \geq 0.57$, preferably $X \geq 0.60$, more preferably $X \geq 0.70$.

The weight average molecular weight Mw of the binder resin of the present invention is preferably within a range of from $3.0 \times 10^2$ to $3.0 \times 10^4$, as measured by gel permeation chromatography (GPC) and calculated as polystyrene. More preferably, it is within a range of from $1.0 \times 10^3$ to $1.0 \times 10^4$. In general, if it is less than $3.0 \times 10^2$ the film forming property tends to be poor, and if it exceeds $3.0 \times 10^4$ the sensitivity tends to be remarkably low.

The amount of an unreacted monomer in the binder resin of the present invention is usually not more than 5 mol %, preferably not more than 2 mol %. If the amount of the unreacted monomer exceeds 5 mol %, the chemical resistance tends to be poor, or the printability is likely to be low, such being undesirable. The amount of the unreacted monomer in the resin may be controlled to be not more than 2 mol %, for example, by increasing the degree of reduction of the pressure after the condensation reaction.

The proportion of the binder resin in the photosensitive composition (at the time of forming a photosensitive layer) of the present invention is usually from 30 to 95 wt %, preferably from 50 to 90 wt %.

When the binder resin satisfies the above requirements, the present invention presents an advantage such that a photosensitive lithographic printing plate made from a photosensitive composition containing such a binder resin, has high sensitivity and excellent developability and is excellent in the BP aptitude and the contrasty property. Further, it is preferred to control the content of a bivalent metal in the photosensitive composition to a level of not higher than 0.1 wt %, whereby the exposure image-forming property will be further improved without impairing various properties required for the photosensitive composition, such as the sensitivity, the contrasty property, the chemical resistance and the BP aptitude. The measurement of the content of a bivalent metal is conducted by a fluorescent X-ray analysis (hereinafter referred to simply as XRF).

In the present invention, measurement of XRF is carried out under the following conditions. The binder resin is finely pulverized to a level of not larger than 1000 mesh by means of System 3370, Rigaku Denki K. K. and press-molded in a copper ring having an inner diameter of 27 mm to obtain a sample, which is then subjected to the measurement.

The binder resin of the present invention may be obtained either by using a catalyst containing no bivalent metal component in the above-mentioned method for its production, or by using a bivalent metal component-containing catalyst and removing the bivalent metal component after the production by e.g. filtration. The bivalent metal content in the binder resin is preferably not higher than 0.1 wt %, more preferably not higher than 0.01 wt %.

The quinonediazide compound to be used in the present invention may, for example, be an ester of o-naphthoquinonediazide sulfonic acid with a polycondensation resin of a phenol with an aldehyde or a ketone. The phenol for such a polycondensation resin may, for example, be a monovalent phenol such as phenol, o-cresol, m-cresol, p-cresol, 3,5-xylenol, carbachol or thymol, a bivalent phenol such as catechol, resorcinol or hydroquinone, or a trivalent phenol such as pyrogallol or phloroglucin. The aldehyde may, for example, be formaldehyde, acetoaldehyde, benzaldehyde, crotonaldehyde or furfural. The ketone may, for example, be acetone or methyl ethyl ketone.

Specific examples of such a polycondensation resin include a phenol/formaldehyde resin, a m-cresol/formaldehyde resin, a m- and p-mixed cresols/formaldehyde resin, a resorcinol/benzaldehyde resin, and a pyrogallol/acetone resin.

The esterification ratio (the reaction ratio to one OH group) of o-naphthoquinonediazide sulfonic acid to the OH group of the phenol in the polycondensation resin of the o-naphthoquinonediazide compound, is preferably from 15 to 80%, more preferably from 20 to 45%.

Further, the quinonediazide compound to be used in the present invention may be the following compounds disclosed in Japanese Unexamined Patent Publication No. 43451/1983. Namely, known 1,2-quinonediazide compounds may, for example, be used, such as a 1,2-benzoquinonediazide sulfonic acid ester, a 1,2-naphthquinonediazide sulfonic acid ester, a 1,2- benzoquinonediazide sulfonic acid amide and a 1,2-naphthquinonediazide sulfonic acid amide.

More specifically, 1,2-quinonediazide compounds disclosed by J. Kosar, "Light-Sensitive Systems", p. 339–352 (1965), John Wiley and Sons (New York) or W. S. De Forest "Photoresist" vol 50, (1975), Mc Graw-Hill (New York), may, for example be mentioned, such as 1,2-benzoquinonediazide-4-sulfonic acid phenyl ester, 1,2,1',2'-di-(benzoquinonediazide-4-sulfonyl)-dihydroxybiphenyl, 1,2-benzoquinonediazide-4-(N-ethyl-N-β-naphthyl)-sulfoneamide, 1,2-naphthoquinonediazide-5-sulfonic acid cyclohexyl ester, 1-(1,2-naphthquinonediazide-5-sulfonyl)-3,5-dimethylpyrazole, 1,2-naphthoquinonediazide-5-sulfonic acid-4"-hydroxydiphenyl-4"-azo-β-naphthol ester, N,N-di-(1,2-naphthoquinonediazide-5-suofonyl)-aniline, 2'-(1,2-naphthoquinonediazide-5-sulfonyloxy)-1-hydroxyanthraquinone, 1,2-naphthoquinonediazide-5-sulfonic acid-2,4-dihydroxybenzophenone ester, 1,2-naphthoquinonediazide-5-sulfonic acid-2,3,4-trihydroxybenzophenone ester, a condensation product of two mols of 1,2-naphtoquinonediazide-5-sulfonic acid chloride with one mol of 4,4'-diaminobenzophenone, a condensation product of two mols of 1,2-naphthoquinonediazide-5-sulfonic acid chloride with one mol of 4,4'-dihydroxy-1,1'-diphenylsulfone, a condensation product of one mol of 1,2-naphthoquinonedizide-5-sulfonic acid chloride with 1 mol of purpurogallin, and 1,2-naphtoquinonediazide-5-(N-dihydroabietyl)-sulfone amide. Further, 1,2-quinonediazide compounds disclosed in Japanese Examined Patent Publications No. 1953/1962, No. 3627/1962, No. 13109/1962, No. 26126/1965, No. 3801/1965, No. 5604/1970, No. 27345/1970 and No. 13013/1976 and Japanese Unexamined Patent Publications No. 96575/1973, No. 63802/1973 and No. 63803/1973 may also be mentioned.

The above compounds may be used alone or in combination as a mixture of two or more of them. The proportion of the quinonediazide compound in the photosensitive composition of the present invention (at the time of forming a photosensitive layer) is preferably from 5 to 70 wt %, more preferably from 10 to 50 wt %.

The photosensitive composition of the present invention may contain, in addition to the above-mentioned various materials, other additives as the case requires. As a plasticizer, various low molecular weight compounds such as phthalic acid esters, triphenylphosphates and maleic acid esters may, for example, be mentioned. As a coating property-improving agent, a surfactant such as a fluorine type surfactant, or a nonionic surfactant represented by ethylcellulose polyalkylene ether, may, for example, be mentioned. Further, a print out material to form a visible image by exposure, may be mentioned. The print out material is composed of a compound which forms an acid or a free group upon exposure and a colorant which interacts with such a compound to undergo color change. The compound which forms an acid or a free group upon exposure includes, for example, an o-naphthoquinonediazide-4-sulfonic acid halogenide as disclosed in Japanese Unexamined Patent Publication No. 36209/1975, a trihalomethyl-2-pyrone and a trihalomethyl-triazine as disclosed in Japanese Unexamined Patent Publication No. 36223/1978, an esterified compound of an o-naphthoquinonediazide-4-sulfonic acid chloride with a phenol or aniline having an electron attractive substituent, as disclosed in Japanese Unexamined Patent Publication No. 6244/1980, and a halomethyl-vinyloxadiazole compound and a diazonium salt as disclosed in Japanese Unexamined Patent Publication No. 77742/1980. Preferably employed as the compound which forms an acid or a free group upon exposure, is a s-triazine compound having a trihaloalkyl group of the following formula (I), or an oxadiazole compound of the following formula (II).

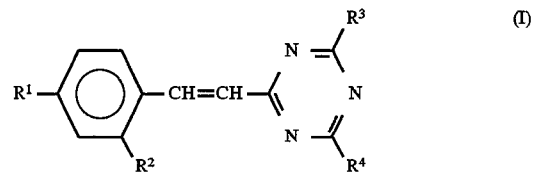

wherein each of $R^1$ and $R^2$ is an alkyl group, an alkoxy group, a substituted alkoxy group or a hydrogen atom, and each of $R^3$ and $R^4$ is a haloalkyl group or a haloalkenyl group having from 1 to 3 carbon atoms.

Typical examples of the s-triazine compound of the formula (I) will specifically be mentioned hereinafter, but the s-triazine compound to be used in the present invention is not limited to such specific examples.

In the following examples, each of $R^1$ and $R^2$ is a hydrogen atom, and each of $R^3$ and $R^4$ is a trichloromethyl group unless otherwise specified.

(I-1) $R^1$: Methoxy group
(I-2) $R^1$: Ethoxy group
(I-3) $R^1$: Propoxy group
(I-4) $R^1$: Butoxy group
(I-5) $R^2$: Methoxy group
(I-6) $R^2$: Ethoxy group
(I-7) $R^2$: Propoxy group
(I-8) $R^2$: Butoxy group
(I-9) Each of $R^1$ and $R^2$: Methoxy group
(I-10) Each of $R^1$ and $R^2$: Ethoxy group
(I-11) Each of $R^1$ and $R^2$: Propoxy group
(I-12) Each of $R^1$ and $R^2$: Butoxy group
(I-13) $R^1$: Methyl group
(I-14) $R^1$: Ethyl group
(I-15) $R^1$: Propyl group
(I-16) $R^1$: Butyl group
(I-17) $R^2$: Methyl group
(I-18) $R^2$: Ethyl group
(I-19) $R^2$: Propyl group
(I-20) $R^2$: Butyl group
(I-21) Each of $R^1$ and $R^2$: Methyl group
(I-22) Each of $R^1$ and $R^2$: Ethyl group
(I-23) Each of $R^1$ and $R^2$: Propyl group
(I-24) Each of $R^1$ and $R^2$: Butyl group

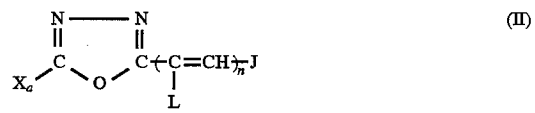

wherein $X_a$ is a trihaloalkyl group having from 1 to 3 carbon atoms, L is a hydrogen atom or a methyl group, J is a substituted or unsubstituted aryl group, or a heterocyclic group, and n is 0, 1 or 2. The oxadiazole compound of the formula (II) may, for example, be an oxiadiazole compound having a benzofuran ring, such as

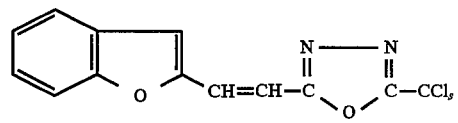

or

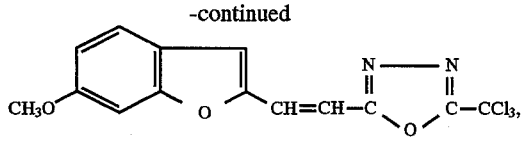

a 2-trichloromethyl-5-(p-methoxystyryl)-1,3,4-oxadiazole compound as disclosed in Japanese Unexamined Patent Publication No. 74728/1979, the following compound as disclosed in Japanese Unexamined Patent Publication No. 241049/1985:

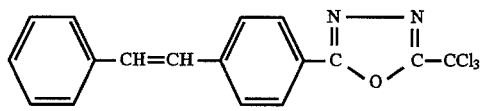

the following compound as disclosed in Japanese Unexamined Patent Publication No. 74728/1979:

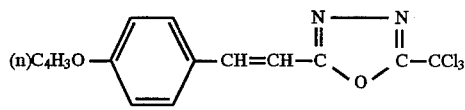

the following compound as disclosed in Japanese Unexamined Patent Publication No. 77742/1980:

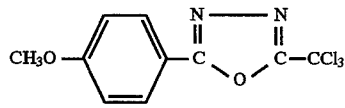

the following compound as disclosed in Japanese Unexamined Patent Publication No. 3626/1985:

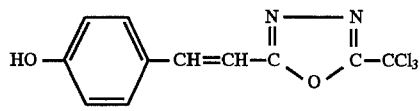

the following compound as disclosed in Japanese Unexamined Patent Publication No. 177340/1985:

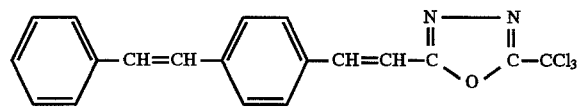

or the following compound as disclosed in Japanese Unexamined Patent Publication No. 143748/1985:

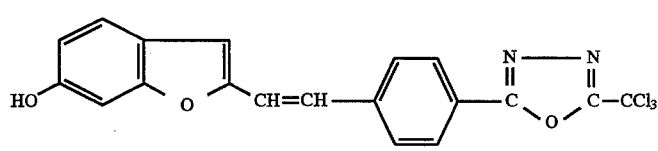

As another compound which can be used for the same purpose, a diazonium salt compound may be mentioned. As the diazonium salt compound, a diazonium salt which generates a strong Lewis acid upon exposure, is preferred, and as the counter ion portion, a counter ion of an inorganic compound is recommended. As a specific example of such a compound, an aromatic diazonium salt may be mentioned, wherein the anion portion of the diazonium salt is at least one member selected from the group consisting of an arsenic fluoride ion, an antimony fluoride ion, an antimony chloride ion, a tin chloride ion, a bismuth chloride ion and a zinc chloride ion. Preferred is a paradiazophenylamine salt.

The amount of the above-mentioned compound which forms an acid or a free group upon exposure in the total photosensitive composition is preferably from 0.01 to 20 wt %, more preferably from 0.1 to 20 wt %, most preferably from 0.2 to 20 wt %.

On the other hand, the colorant includes two types i.e. one which develops a color and the other which undergoes discoloration or color fading. As a colorant which undergo discoloration or color fading, various dyes may effectively be used, including diphenylmethane type, triphenylmethane type, thiazine type, oxazin type, xanthene type, anthraquinone type, iminonaphthoquinone type and azomethine type dyes.

Specifically, it may, for example, be Brilliant Green, Eosine, Ethyl Violet, Erythrocin B, Methyl Green, Crystal Violet, Basic Fuchsine, Phenolphthalein, 1,3-Diphenyltriazine, Alizarine Red S, Thymolphthalein, Methyl Violet 2B, Quinaldine Red, Rose Bengale, Metanil Yellow, Thymolsulfophthalein, Xylenol Blue, Methyl Orange, Orange IV, Diphenyl thiocarbazone, 2,7-dichlorofluorescein, Paramethyl Red, Congo Red, Benzopurpurine 4B, α-Naphthyl Red, Nile Blue 2B, Nile Blue 2A, Phenacetalin, Methyl Violet, Malachite Green, Parafuchsine, Victoria Pure Blue BOH (manufactured by Hodogaya Chemical Co., Ltd.), Oil Blue #603 (manufactured by Orient Chemical Industry Co., Ltd.), Oil Pink #312 (manufactured by Orient Chemical Industry Co., Ltd.), Oil Red 5B (manufactured by Orient Chemical Industry Co., Ltd.), Oil Scarlet #308 (manufactured by Orient Chemical Industry Co., Ltd.), Oil Red OG (manufactured by Orient Chemical Industry Co., Ltd.), Oil Red RR (manufactured by Orient Chemical Industry Co., Ltd.), Oil Green #502 (manufactured by Orient Chemical Industry Co., Ltd.), Spiron Red BEH Special (manufactured by Hodogaya Chemical Co., Ltd.), m-Cresol Purple, Cresol Red, Rhodamine B, Rhodamine 6G, First acid Violet R, Sulfo Rhodamine B, Auramine, 4-p-diethylaminophenyliminonaphthoquinone, 2-carboxyanilino-4-p-diethylaminophenylimionaphthoquinone, 2-carbostearylamino-4-p-dihydroxyethylamino-phenyliminonaphthoquinone, p-methoxybenzoyl-p'-diethylamino-o'-methylphenyliminoacetoanilide, cyano-p-diethylaminophenyliminoacetoanilide, 1-phenyl-3-methyl-4-p-diethylaminophenylimino-5-pyrazolone, or 1-β-naphthyl-4-p-diethylaminophenylimino-5-pyrazolone.

Further, as the colorant which develops a color, aryl amines may, for example, be mentioned. Aryl amines suitable for this purpose include so-called leuco dyes in addition to simple aryl amines such as primary or secondary aromatic amines.

Specifically, it may, for example, be diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-bromo-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p"-hexamethyltriaminotriphenylmethane, p,p'-tetramethyldiaminotriphenylmethane, p,p'-tetramethyldiaminodiphenylmethylimine, p,p',p"-triamino-o-methyltriphenylmethane, p,p',p"-triaminotriphenylcarbinol, p,p'-tetramethylaminodiphenyl-4-anilinonaphthylmethane, p,p',p"-triaminotriphenylmethane or p,p',p"-hexapropyltriaminotriphenylmethane.

In the present invention, a dye which is capable of color change within a pH range of from 1 to 5, is preferred among the above colorants.

The amount of the colorant is preferably from 0.01 to 10 wt %, more preferably from 0.02 to 5 wt %, based on the total solid content of the photosensitive composition. Theses colorants may be used alone or in combination as a mixture of two or more of them.

Further, in order to improve the sensitivity, a sensitizer may be incorporated to the photosensitive composition of the present invention. The sensitizer includes, for example, gallic acid derivatives as disclosed in Japanese Unexamined Patent Publication No. 18237/1982, 5-membered ring acid anhydrides, such as phthalic anhydride, tetrahydrophthalic anhydride, maleic anhydride and succinic anhydride, as disclosed in Japanese Unexamined Patent Publication No. 80022/1982, 6-membered ring acid anhydrides such as glluthalic anhydride and its derivatives, as disclosed in Japanese Unexamined Patent Publication No. 11932/1983. Preferred among them are cyclic anhydrides. Particularly preferred are 6-membered cyclic anhydrides.

Further, a lipophilic resin may be incorporated to the photosensitive composition of the present invention to improve the lipophilic property of the photosensitive composition.

The above-mentioned various components for the photosensitive composition of the present invention are dissolved in a solvent as described below, and the solution is coated and dried on the surface of a suitable support to form a photosensitive layer, to obtain a photosensitive lithographic printing plate.

The solvent useful for dissolving the various components may, for example, be a cellosolve such as methylcellosolve, methylcellosolve acetate, ethylcellosolve or ethylcellosolve acetate, dimethylformamide, dimethylsulfoxide, dioxane, acetone, cyclohexanone, trichloroethylene, methyl ethyl ketone, a carbitol such as diethylene glycol dimethyl ether, diethylene glycol methyl ether or ethylcarbitol, a propylene glycol such as propylene glycol monomethyl ether acetate, or ethyl lactate.

Among them, a carbitol, a propylene glycol or ethyl lactate may, for example, preferably be used from the viewpoint of non-toxity to the human body. These solvents may be used alone or in combination as a mixture of two or more of them.

As a coating method to be used for applying the photosensitive composition of the present invention to the surface of a support, a conventional method such as sping coating, wire bar coating, dip coating, air knife coating, roll coating, blade coating, or curtain coating may, for example, be employed. The amount of coating varies depending upon the particular purpose, but it is usually within a range of from 0.1 to 5.0 $g/m^2$, preferably from 0.5 to 5.0 $g/m^2$ (as solid content). The temperature for drying may, for example, be from 20° to 150° C., preferably from 30° to 100° C.

In the photosensitive lithographic printing plate of the present invention, the support on which a photosensitive layer is formed, may, for example, be a metal plate such as an aluminum, zinc, steel or copper plate, a metal plate plated or vapor deposited with e.g. chromium, zinc, copper, nickel, aluminum or iron, a paper sheet, a plastic film, a glass sheet, a paper sheet coated with a resin, a paper sheet lined with a metal foil such as an aluminum foil, or a plastic film treated for imparting a hydrophilic property. Among them, an aluminum plate is preferred. More preferably, an aluminum plate having grain treatment, anodizing treatment and, if necessary, surface treatment such as pore sealing treatment, applied, may be employed as the support for the photosensitive lithographic printing plate of the present invention.

Conventional methods may be employed for these treatments.

As a grain treatment method, a mechanical method or an electrolytic etching method may, for example, be mentioned. The mechanical method may, for example, be a ball polishing method, a brush polishing method, a liquid horning polishing method, or a buff polishing method. Depending upon the composition of the aluminum material, the above-mentioned various methods may be used alone or in combination. Preferred is an electrolytic etching method.

The electrolytic etching is carried out in a bath containing one or more of inorganic acids such as phosphoric acid, sulfuric acid, hydrochloric acid and nitric acid. After the grain treatment, desmatte treatment is carried out by means of an aqueous alkaline or acidic solution for neutralization, as the case requires, followed by washing with water.

The anodizing treatment is carried out by electrolysis using an aluminum plate as an anode and a solution containing one or more acids such as sulfuric acid, chromic acid, oxalic acid, phosphoric acid and malonic acid, as an electrolyte. The amount of the formed anodized film is suitably from 1 to 50 $mm/dm^2$, preferably from 10 to 40 $mm/dm^2$. The amount of the anodized film may be determined by immersing the aluminum plate in a chromium phosphate solution (prepared by dissolving 35 ml of 85% phosphoric acid solution and 20 g of chromium (VI) oxide in 1 l of water) to dissolve the anodized film, whereupon the amount is obtained by measuring the weight change as between before and after dissolving the anodized film of the plate.

The pore-sealing treatment may, for example, be boiling water treatment, steam treatment, sodium silicate treatment or treatment with an aqueous dichromate solution. Further, primer treatment with an aqueous solution of a metal salt such as zirconic fluoride or a water-soluble polymer compound, may be applied to the aluminum plate support.

The photosensitive lithographic printing plate of the present invention can be treated for development by a conventional method. For example, through a transparent positive image film, it is exposed by a light source such as a high pressure mercury lamp, a metal halide lamp, a xenon lamp or a tungsten lamp and then developed with various alkali developers. As a result, only non-exposed portions will remain on the surface of the support to form a positive-positive type relief image.

The alkali developer may, for example, be an aqueous solution of an alkali metal salt such as sodium hydroxide, potassium hydroxide, sodium carbonate, potassium carbonate, sodium metasilicate, potassium metasilicate, sodium secondary phosphate or sodium tertiary phosphate. The concentration of the alkali metal salt is preferably from 0.1 to 10 wt %. Further, an anionic surfactant, an amphoteric surfactant or an organic solvent such as an alcohol may, for example, be incorporated to the developer, as the case requires.

By the use of a novolak resin satisfying the specific conditions, the photosensitive composition of the present invention is excellent in each of the sensitivity, the developability, the BP property and the contrasty property, and their color change after exposure and the resistance against treating reagents used for printing are also excellent.

Now, the present invention will be described in further detail with reference to Preparation Examples and Working Examples. However, it should be understood that the present invention is by no means restricted to such specific Examples.

Measurement of $^{13}$C-NMR of the novolak resins prepared in the following Preparation Examples, was carried out under the following conditions. Using EX-270 model Fourier transform NMR apparatus (resonance frequency: 67.00 MHz), a reverse gated decoupling method (non-NOE decoupling measurement) was applied. Temperature for measurement: 22°–24° C., pulse width: 6.8 μs (about 45°), waiting time: 3 seconds, observation frequency width: 20,000 Hz, data point number: 33K, number of integration: at least 4,000 times, standard: tetramethylsilane being 0.0 ppm.

Preparation of novolak resins

PREPARATION EXAMPLE 1

Into a 300 ml separable flask, 42.00 g of phenol, 32.18 g of m-cresol (molar ratio of phenol/m-cresol=60/40), 35.88 g of formalin (37% aqueous solution), and 0.80 g of zinc acetate dihydrate were charged and reacted under heating with stirring for one hour in an oil bath of 110° C. The product was dried under reduced pressure to obtain a novolak resin. The weight average molecular weight of this resin by GPC chromatography was 5,000.

PREPARATION EXAMPLE 2

A novolak resin was prepared in the same manner as in Preparation Example 1 except that 40.25 g of phenol, 34.19 g of m-cresol (molar ratio of phenol/m-cresol=57.5/42.5), and 33.78 g of formalin were used. The weight average molecular weight of the obtained resin was 3,700.

PREPARATION EXAMPLE 3

A novolak resin was prepared in the same manner as in Preparation Example 1 except that 52.50 g of phenol, 20.11 g of m-cresol (molar ratio of phenol/m-cresol=75/25), and 36.79 g of formalin were used. The weight average molecular weight of the obtained resin was 6,500.

PREPARATION EXAMPLE 4

A novolak resin was prepared in the same manner as in Preparation Example 1 except that 42.00 g of phenol, 24.13 g of m-cresol, 8.04 g of p-cresol (molar ratio of phenol/m-cresol/p-cresol=60/30/10), and 34.98 g of formalin were used. The weight average molecular weight of the obtained resin was 6,300.

PREPARATION EXAMPLE 5

A novolak resin was prepared in the same manner as in Preparation Example 1 except that 42.00 g of phenol, 16.09 g of m-cresol, 16.09 g of p-cresol (molar ratio of phenol/m-cresol/p-cresol=60/20/20), and 36.79 g of formalin were used. The weight average molecular weight of the obtained resin was 3,100.

PREPARATION EXAMPLE 6

A novolak resin was prepared in the same manner as in Preparation Example 1 except that 42.00 g of phenol, 8.04 g of m-cresol, 24.13 g of p-cresol (molar ratio of phenol/m-cresol/p-cresol=60/10/30), and 36.20 g of formalin were used. The weight average molecular weight of the obtained resin was 6,000.

PREPARATION EXAMPLE 7

A novolak resin was prepared in the same manner as in Preparation Example 1 except that 28.00 g of phenol, 48.26 g of m-cresol (molar ratio of phenol/m-cresol=40/60), and 34.67 g of formalin were used. The weight average molecular weight of the obtained resin was 2,800.

PREPARATION EXAMPLE 8

A novolak resin was prepared in the same manner as in Preparation Example 1 except that 31.50 g of phenol, 44.24 g of m-cresol (molar ratio of phenol/m-cresol=45/55), and 34.98 g of formalin were used. The weight average molecular weight of the obtained resin was 3,000.

PREPARATION EXAMPLE 9

A novolak resin was prepared in the same manner as in Preparation Example 1 except that 3.50 g of phenol, 45.84 g of m-cresol, 30.56 g of p-cresol (molar ratio of phenol/m-cresol/p-cresol=5/57/38), and 37.69 g of formalin were used. The weight average molecular weight of the obtained resin was 2,500.

PREPARATION EXAMPLE 10

A novolak resin was prepared in the same manner as in Preparation Example 9 except that as the acid catalyst, oxalic acid dihydrate was used. The weight average molecular weight of the obtained resin was 3,100.

PREPARATION EXAMPLE 11

A novolak resin was prepared in the same manner as in Preparation Example 2 except that as the acid catalyst, 0.80 g of oxalic acid dianhydrate was used. The weight average molecular weight of the obtained resin was 4,300.

PREPARATION EXAMPLE 12

Into a 300 ml separable flask, 42.00 g of phenol, 16.09 g of m-cresol, 16.09 of p-cresol (molar ratio of phenol/m-cresol/p-cresol=60/20/20), 36.79 g of formalin and 1.0 g of zinc oxide were charged and reacted under heating with stirring for one hour in an oil bath of 110° C. The product was dried under reduced pressure to obtain a novolak resin. The weight average molecular weight of this resin by GPC was 1,600.

PREPARATION EXAMPLE 13

The novolak resin obtained in Preparation Example 12 was dissolved in ethyl acetate, and the solution was stirred with a 1N hydrochloric acid aqueous solution in a separating funnel to separate an organic layer and an aqueous layer. The organic layer was dried over anhydrous sodium sulfate and then concentrated under reduced pressure to obtain a novolak resin having the zinc component in the resin removed. The proportion of the zinc component in the novolak resin was 0.001 wt %.

PREPARATION EXAMPLE 14

A novolak resin was prepared in the same manner as in Preparation Example 12 except that 42.00 g of phenol, 16.09 g of m-cresol, 16.09 g of p-cresol (molar ratio of phenol/m-cresol/p-cresol=60/20/20), and 38.99 g of formalin were used. The weight average molecular weight of the obtained resin was 2,000.

PREPARATION EXAMPLE 15

The novolak resin prepared in the same manner as in Preparation Example 14 was dissolved in ethyl acetate, and the solution was stirred together with a 1N hydrochloric acid aqueous solution by a separating funnel to separate an organic layer and an aqueous layer. The organic layer was dried over anhydrous sodium sulfate and then concentrated under reduced pressure to obtain a novolak resin having a zinc component in the resin removed. The proportion of the zinc content in the novolak resin was 0.002 wt %.

PREPARATION EXAMPLE 16

A novolak resin was prepared in the same manner as in Preparation Example 12 except that 42.00 g of phenol, 16.09 g of m-cresol, 16.09 g of p-cresol (molar ratio of phenol/m-cresol/p-cresol=60/20/20), and 39.29 g of formalin were used. The weight average molecular weight of the obtained resin was 2,800.

PREPARATION EXAMPLE 17

The novolak resin obtained in Preparation Example 16 was dissolved in ethyl acetate, and this solution was stirred together with a 1N hydrochloric acid aqueous solution in a separating funnel to separate an organic layer and an aqueous layer. The organic layer was dried over anhydrous sodium sulfate and then concentrated under reduced pressure to obtain a novolak resin having the zinc component in the resin removed. The proportion of the zinc component in the novolak resin was 0.002 wt %.

PREPARATION EXAMPLE 18

A novolak resin was prepared in the same manner as in Preparation Example 12 except that 42.00 g of phenol, 16.09 g of m-cresol, 16.09 g of p-cresol (molar ratio of phenol/m-cresol/p-cresol=60/20/20), 36.79 g of formalin and 0.8 g of zinc acetate dihydrate were used. The weight average molecular weight of the obtained resin was 3,100.

PREPARATION EXAMPLE 19

The novolak resin obtained in Preparation Example 18 was dissolved in ethyl acetate, and the solution was stirred together with a 1N hydrochloric acid aqueous solution in a separating funnel to separate an organic layer and an aqueous layer. The organic layer was dried over anhydrous sodium sulfate and then concentrated under reduced pressure to obtain a novolak resin having the zinc component in the resin removed. The proportion of the zinc component in the novolak resin was 0.16 wt %.

PREPARATION EXAMPLE 20

A novolak resin was prepared in the same manner as in Preparation Example 12 except that 31.50 g of phenol, 44.24 g of m-cresol (molar ratio of phenol/m-cresol=45/55), 34.98 g of formalin and 0.8 g of zinc acetate dihydrate were used. The weight average molecular weight of the obtained resin was 3,000.

PREPARATION EXAMPLE 21

The novolak resin obtained in Preparation Example 20 was dissolved in ethyl acetate, and the solution was stirred together with a 1N hydrochloric acid aqueous solution in a separating funnel to separate an organic layer and an aqueous layer. The organic layer was dried over anhydrous sodium sulfate and then concentrated under reduced pressure to obtain a novolak resin having the zinc component in the resin removed. The proportion of the zinc component in the novolak resin was 0.43 wt %.

PREPARATION EXAMPLE 22

A novolak resin was prepared in the same manner as in Preparation Example 1 except that 3.50 g of phenol, 45.84 g of m-cresol, 30.56 g of p-cresol (molar ratio of phenol/m-cresol/p-cresol=5/57/38), 36.02 g of formalin and 0.8 g of oxalic acid dihydrate were used. The weight average molecular weight of the obtained resin was 3,100, and no bivalent metal component was detected.

EXAMPLES AND COMPARATIVE EXAMPLES

Preparation of aluminum plate

An aluminum plate having a thickness of 0.24 mm (material: 1050, hardness: H16) was subjected to degreasing treatment in a 5 wt % sodium hydroxide aqueous solution at 60° C. for one minute and then to electrolytic etching treatment in 1 l of a 0.5 mol hydrochloric acid aqueous solution at a temperature of 25° C. at a current density of 60A/dm$^2$ for a treating time of 30 seconds. Then, it was subjected to desmatte treatment in a 5 wt % sodium hydroxide aqueous solution at 60° C. for 10 seconds and then to anodizing treatment in a 20 wt % sulfuric acid solution at a temperature of 20° C. at a current density of 3A/dm$^2$ for a treating time of 1 minute. Further, it was subjected to hot water pore sealing treatment with hot water of 80° C. for 20 seconds to obtain an aluminum plate as a support for a lithographic printing plate.

EXAMPLES 1 TO 6 AND COMPARATIVE EXAMPLES 1 TO 5

Preparation of positive photosensitive lithoqraphic printing plates

On the aluminum plate prepared as described above, a photosensitive composition coating liquid having the following composition containing a quinonediazide compound and a novolak resin prepared in each of the above Preparation Examples 1 to 11, was coated by means of a wire bar and dried at 90° C. for 4 minutes to obtain a positive photosensitive lithographic printing plate having a thickness of 2.2 g/m$^2$ (printing plates 1 to 11 as identified in Table 1).

Composition of the photosensitive composition coating liquid (1)Quinonediazide compound QD-1 as shown by the following formula (MW of the resin prior to reacting QD=2, 500) 1.4g

QD-1:

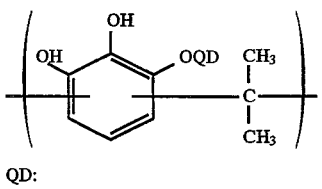

QD:

-continued

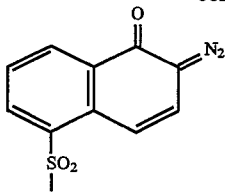

(2) Novolak resin prepared in each Preparation Example 5.0g (3) 2-Trichloroemthyl-5-(p-methoxystyryl)-1,3,4-oxadiazole 0.11 g (4) Victoria Pure Blue BOH manufactured by Hodogaya Chemical Co., Ltd. 0.07 g (5) Methylcellosolve 100 ml Developability test A positive film having a picture pattern was overlaid closely on each of the obtained photosensitive lithographic printing plates 1 to 11, followed by exposure under a condition of 8.0 mW/cm² using a 2KW metal halide lamp (SPG-1000, manufactured by Nippon Denchi K. K.) as a light source. Then, to this test sample, development treatment was applied at 25° C. for 40 seconds using a developer (standard developer) prepared by diluting SDR-1 (manufactured by Konica K. K.) 6 times with water, a developer (under developer) prepared by diluting it from 9 to 11 times or a developer (over developer) prepared by diluting it 4 times. The surface of the test sample after the treatment was visually inspected and evaluated in accordance with the following evaluation standards. The results are shown in Table 1.

Evaluation standards for under developability

○: The photosensitive layer along the non-image portion was completely dissolved and removed.

Δ: The photosensitive layer along the non-image portion partially remained.

×: The photosensitive layer along the non-image portion was not substantially dissolved.

Evaluation standards for over developability

○: No defect of the image portion observed.

Δ: The film along the image portion was reduced.

Treating agent resistance test

To study the treating agent resistance, durability against Ultraplate Cleaner (UPC, manufactured by ABC Chemical Company) which is useful as a cleaning liquid for removing the ground stain formed on a non-image portion during printing, was examined. A printing plate having an image formed thereon, was immersed in the above treating liquid for a predetermined period of time (UPC: two hours) at room temperature and then washed with water, whereupon the image portion was compared with the image portion before immersion, and the degree of corrosion of the image portion by the treating reagent was evaluated. The results are shown in Table 1.

Evaluation standards for treating reagent resistance

○: No corrosion of the image portion observed.

Δ: Corrosion of the image portion partially observed.

×: Corrosion of the entire image portion observed.

Clear sensitivity and contrasty property evaluation test

Clear sensitivity was evaluated in accordance with the following method, and the results are shown in Table 1.

A step tablet for measuring sensitivity (a gray scale of 21 steps with a density difference of 0.5 per each step, No. 2, manufactured by Eastman Kodak) was overlaid closely on the photosensitive lithographic printing plate, followed by exposure under a condition of 8.0 mW/cm² using a 2 KW metal halide lamp (SPG-1000, manufactured by Nippon Denchi K. K.) as a light source. Then, to this test sample, development treatment was applied at 25° C. for 40 seconds by means of a developer (standard developer) prepared by diluting SDR-1 (manufactured by Konica K. K.) 6 times with water. After the treatment, the number of steps of the above step tablet which were completely developed was taken as the clear sensitivity.

In the evaluation of the contrasty property, the "clear step number" is the number of steps of the above step tablet which were completely developed, and the "solid step number" is the number of steps of the above step tablet which were not completely developed. The contrasty property is evaluated by a value of "solid step number"-"clear step number". The smaller this value, the better the contrasty property. The contrasty property was evaluated in accordance with the following evaluation standards, and the results are shown in Table 2.

Evaluation standards for the contrasty property

○: "Solid step number"-"clear step number"=not higher than 7.0

Δ: "Solid step number"-"clear step number"=7.0 to 8.0

BP aptitude test

On each of the obtained lithographic printing plates 1 to 11, a ball point pen drawing was made under a pen pressure of 50 g. Then, the printing plate was subjected to development treatment at 27° C. for 20 seconds by means of a SDR-1 developer (manufactured by Konica K. K.) diluted 6 times. The defects of the image portion of the ball point pen drawing are shown in Table 2.

Evaluation standards for ball point pen drawing defects

○: No defects

Δ: Defects were observed at the image portion

As is evident from the results in Tables 1 and 2, lithographic printing plates prepared by using the photosensitive compositions of the present invention, are excellent in the treating reagent resistance, have high clear sensitivity and are excellent also in the developability as well as the BP aptitude and the contrasty property.

TABLE 1

| | Photosensitive lithographic printing plate | Novolak resin | X | Compositional ratio (phenol/m-alkylphenol/p-alkylphenol) | Treating reagent resistance UPC | Clear sensitivity | Under developability | | | Over developability |
|---|---|---|---|---|---|---|---|---|---|---|
| | | | | | | | x9 | x10 | x11 | x4 |
| Example 1 | 1 | Preparation Example 1 | 0.63 | 60/40/0 | ○ | 4.0 | ○ | ○ | Δ | ○ |
| Example 2 | 2 | Preparation | 0.64 | 57.5/42.5/0 | ○ | 4.25 | ○ | ○ | Δ | ○ |

TABLE 1-continued

| Photosensitive lithographic printing plate | Novolak resin | X | Compositional ratio (phenol/m-alkylphenol/ p-alkylphenol) | Treating reagent resistance UPC | Clear sensitivity | Under developability x9 | Under developability x10 | Under developability x11 | Over developability x4 |
|---|---|---|---|---|---|---|---|---|---|
| Example 3 | 3 | Preparation Example 2 | 0.60 | 75/25/0 | O | 4.75 | O | O | O | O |
| Example 4 | 4 | Preparation Example 3 | 0.63 | 60/30/10 | O | 4.0 | O | O | Δ | O |
| Example 5 | 5 | Preparation Example 4 | 0.62 | 60/20/20 | O | 4.25 | O | O | O | O |
| Example 6 | 6 | Preparation Example 5 | 0.60 | 60/10/30 | O | 4.75 | O | O | O | O |
| Comparative Example 1 | 7 | Preparation Example 6 | 0.66 | 40/60/0 | O | 3.75 | O | Δ | × | O |
| Comparative Example 2 | 8 | Preparation Example 7 | 0.66 | 45/55/0 | O | 3.75 | O | Δ | × | O |
| Comparative Example 3 | 9 | Preparation Example 8 | 0.72 | 5/57/38 | × | 3.00 | × | × | × | O |
| Comparative Example 4 | 10 | Preparation Example 9 | 0.56 | 5/57/38 | Δ | 3.75 | O | Δ | × | × |
| Comparative Example 5 | 11 | Preparation Example 10 | 0.50 | 57.5/42.5/0 | Δ | 4.75 | O | O | O | × |

TABLE 2

| Photosensitive lithographic printing plate | Novlak resin | X | Compositional ratio (phenol/m-alkylphenol/ p-alkylphenol) | Contrasty property | Ball point pen drawing defects |
|---|---|---|---|---|---|
| Example 1 | 1 | Preparation Example 1 | 0.63 | 60/40/0 | O | O |
| Example 2 | 2 | Preparation Example 2 | 0.64 | 57.5/42.5/0 | O | O |
| Example 3 | 3 | Preparation Example 3 | 0.60 | 75/25/0 | O | O |
| Example 4 | 4 | Preparation Example 4 | 0.63 | 60/30/10 | O | O |
| Example 5 | 5 | Preparation Example 5 | 0.62 | 60/20/20 | O | O |
| Example 6 | 6 | Preparation Example 6 | 0.60 | 60/10/30 | O | O |
| Comparative Example 1 | 7 | Preparation Example 7 | 0.66 | 40/60/0 | O | O |
| Comparative Example 2 | 8 | Preparation Example 8 | 0.66 | 45/55/0 | O | O |
| Comparative Example 3 | 9 | Preparation Example 9 | 0.72 | 5/57/38 | O | O |
| Comparative Example 4 | 10 | Preparation Example 10 | 0.56 | 5/57/38 | Δ | Δ |
| Comparative Example 5 | 11 | Preparation Example 11 | 0.50 | 57.5/42.5/0 | × | × |

EXAMPLES 7 TO 10 AND COMPARATIVE EXAMPLES 6 AND 7

Preparation of photosensitive lithographic printing plates

On an aluminum plate prepared as described above, a photosensitive composition coating liquid having the following composition containing a quinonediazide compound and a novolak resin prepared in each of Preparation Examples 13, 15, 17, 19, 21 and 22, was coated by a spin coating machine so that the film thickness of the dried coating film would be 2.2 g/m$^2$, followed by drying at 90° C. for 4 minutes to obtain a positive photosensitive lithographic printing plate (printing plates 12 to 17).

Composition of the photosensitive composition coating liquid (1) Quinonediazide compound QD-1 as shown above (MW of the resin prior to reacting QD=2,500) 1.4g
(2) A novolak resin of each Preparation Example 5.0 g
(3) 2-Trichloromethyl-5-(p-methoxystyryl)-1,3,4-oxadiazole 0.11 g
(4) Victoria Pure Blue BOH (manufactured by Hodogaya Chemical Co., Ltd.) 0.07 g
(5) Methylcellosolve 100 ml Developability test A positive film having a picture pattern was overlaid closely on each of the obtained photosensitive lithographic printing plates 12 to 17, followed by exposure under a condition of 8.0 mW/cm$^2$ using a 2 KW metal halide lamp (SPG-1000, manufactured by Nippon Denchi K. K.) as a light source. Then, to this test sample, development treatment was applied at 25° C. for 40 seconds using a developer (standard developer) prepared by diluting SDR-1 (manufactured by Konica K. K.) 6 times with water, a developer (under developer) prepared by diluting it from 21 to 23 times or a developer (over developer) prepared by diluting it 5 times. The surface of the test sample after the treatment was visually inspected and evaluated in accordance with the following evaluation standards. The results are shown in Table 3.

Evaluation standards for under developability

◯: The photosensitive layer along the non-image portion was completely dissolved and removed.

Δ: The photosensitive layer along the non-image portion partially remained.

×: The photosensitive layer along the non-image portion was not substantially dissolved.

Evaluation standards for over developability

◯: No damage of the image portion observed.

Δ: The film along the image portion was reduced.

Exposure image-forming property

Each of the obtained photosensitive lithographic plates 12 to 17 was exposed through a positive transparent original film at a dose of from 50 to 400 mJ/cm² using a metal halide lamp (SPG-1000, manufactured by Nippon Denchi K. K.) as a light source, whereupon the optical density difference ΔOD as between the exposed portion and the non-exposed portion of the photosensitive layer was measured by means of a Macbeth reflection densitometer. The results are shown in Table 3.

3. The photosensitive composition according to claim 1, wherein the phenol component consists of the phenol (1) and at least one of the m-alkylphenol (2) and the p-alkylphenol (3).

4. The photosensitive composition according to claim 1, wherein in the phenol component, the m-alkylphenol contains at least 95 mol % of m-cresol, and the p-alkylphenol contains at least 95 mol % of p-cresol.

5. The photosensitive composition according to claim 1, wherein the phenol component contains at least 25 mol % of the m-alkylphenol (2) and/or the p-alkylphenol (3).

6. The photosensitive composition according to claim 1, wherein the phenol component consists of from 55 to 75 mol % of the phenol (1), from 10 to 45 mol % of the m-alkylphenol (2) and from 0 to 30 mol % of the p-alkylphenol (3).

7. The photosensitive composition according to claim 1, wherein a bivalent metal component in the binder resin is not more than 0.1 wt %.

8. The photosensitive composition according to claim 7, wherein the bivalent metal component in the binder resin is not more than 0.01 wt %.

9. The photosensitive composition according to claim 7, wherein the binder resin is a resin obtained by addition condensation of the phenol component with formaldehyde in the presence of a bivalent metal oxide as a catalyst.

10. The photosensitive composition according to claim 7, the bivalent metal is zinc.

11. The photosensitive composition according to claim 1, wherein the quinonediazide compound is an ester of o-naphthoquinonediazide sulfonic acid with a polycondensate resin of a phenol with an aldehyde or ketone.

TABLE 3

| Photosensitive lithograhic printing plate | Novolak resin | Compositional ratio (phenol/m-alkyl-phenol/p-alkyl-phenol) X | (phenol) | Treating reagent resistance UPC | Clear sensitivity | Under developability ×21 | Under developability ×23 | Over developability ×5 | Contrasty property | Ball point pen drawing defects | Color change after exposure 400 mJ/cm² |
|---|---|---|---|---|---|---|---|---|---|---|---|
| Example 7 | 12 | Preparation Example 13 | 0.77 | 60/20/20 | ◯ | 4.75 | ◯ | ◯ | ◯ | ◯ | ◯ | 0.29 |
| Example 8 | 13 | Preparation Example 15 | 0.78 | 60/20/20 | ◯ | 4.5 | ◯ | ◯ | ◯ | ◯ | ◯ | 0.25 |
| Example 9 | 14 | Preparation Example 17 | 0.78 | 60/20/20 | ◯ | 4.5 | ◯ | ◯ | ◯ | ◯ | ◯ | 0.27 |
| Example 10 | 15 | Preparation Example 19 | 0.77 | 60/20/20 | ◯ | 4.25 | Δ | × | ◯ | ◯ | ◯ | 0.19 |
| Comparative Example 6 | 16 | Preparation Example 21 | 0.66 | 45/55/0 | ◯ | 3.75 | Δ | × | ◯ | ◯ | ◯ | 0.02 |
| Comparative Example 7 | 17 | Preparation Example 22 | 0.56 | 5/57/38 | ◯ | 3.5 | Δ | × | × | Δ | Δ | 0.24 |

We claim:

1. A photosensitive composition comprising a quinonediazide compound and a binder resin, wherein said resin is a resin obtained by condensing a phenol component comprising the following (1) to (3), and an aldehyde or a ketone, and X≧0.57, where X=A/B, where A is an integrated value of peaks from 23.0 to 31.0 ppm, and B is an integrated value of peaks from 23.0 to 37.0 ppm, in the ¹³C-NMR spectrum of a dimethyl sulfoxide deuteride solution of this resin:

Phenol Component
(1) a phenol: from 50 to 100 mol %
(2) a m-alkylphenol: from 0 to 50 mol %
(3) a p-alkylphenol: from 0 to 50 mol %.

2. The photosensitive composition according to claim 1, wherein X≧0.60, where X is as defined above.

12. The photosensitive composition according to claim 1, which further contains a s-triazine compound of the following formula (I) or an oxadiazole compound of the following formula (II):

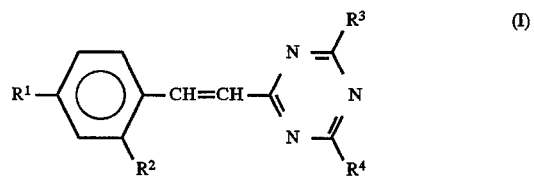

wherein each of R¹ and R² which are independent of each other, is an alkyl group, an alkoxy group, a substituted alkoxy group or a hydrogen atom, and each of $R^3$ and $R^4$ which are independent of each other, is a $C_{1-3}$ haloalkyl group or a $C_{1-3}$ haloalkenyl group;

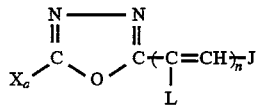 (II)

wherein $X_a$ is a $C_{1-3}$ trihaloalkyl group, L is a hydrogen atom or a methyl group, J is a substituted or unsubstituted aryl or heterocyclic group, and n is 0, 1 or 2.

13. The photosensitive composition according to claim 1, wherein the proportion of the binder resin is from 30 to 95 wt %, and the proportion of the quinonediazide compound is from 5 to 70 wt %.

14. A photosensitive lithographic printing plate comprising a support and a photosensitive layer formed thereon, wherein the photosensitive layer is made of a photosensitive composition comprising a quinonediazide compound and a binder resin, wherein said resin is a resin obtained by condensing a phenol component comprising the following (1) to (3), and an aldehyde or a ketone, and $X \geq 0.57$, where $X=A/B$, where A is an integrated value of peaks from 23.0 to 31.0 ppm, and B is an integrated value of peaks from 23.0 to 37.0 ppm, in the $^{13}$C-NMR spectrum of a dimethyl sulfoxide deuteride solution of this resin:

Phenol Component
(1) a phenol: from 50 to 100 mol %
(2) a m-alkylphenol: from 0 to 50 mol %
(3) a p-alkylphenol: from 0 to 50 mol %.

* * * * *